United States Patent [19]

Iwaoka et al.

[11] Patent Number: 4,694,250
[45] Date of Patent: Sep. 15, 1987

[54] NUCLEAR MAGNETIC RESONANCE IMAGING DEVICE

[75] Inventors: Hideto Iwaoka; Tadashi Sugiyama; Hiroyuki Matsuura; Takaaki Hirata, all of Tokyo, Japan

[73] Assignee: Yokogawa Electric Corporation, Tokyo, Japan

[21] Appl. No.: 833,224

[22] Filed: Feb. 24, 1986

[30] Foreign Application Priority Data

| Feb. 27, 1985 | [JP] | Japan | 60-38235 |
| Feb. 27, 1985 | [JP] | Japan | 60-38236 |
| Mar. 6, 1985 | [JP] | Japan | 60-44158 |
| Aug. 30, 1985 | [JP] | Japan | 60-191528 |
| Aug. 30, 1985 | [JP] | Japan | 60-191529 |
| Sep. 5, 1985 | [JP] | Japan | 60-196661 |

[51] Int. Cl.$^4$ ............................................. G01R 33/20
[52] U.S. Cl. .................................... 324/309; 324/307
[58] Field of Search ............... 324/300, 307, 308, 310, 324/312, 313, 314, 306

[56] References Cited

U.S. PATENT DOCUMENTS

| 4,318,044 | 3/1982 | Mansfield | 324/300 |
| 4,486,709 | 12/1984 | Bendall | 324/307 |
| 4,498,048 | 2/1985 | Lee et al. | 324/318 |
| 4,609,872 | 9/1986 | O'Donnell | 324/306 |

Primary Examiner—Michael J. Tokar
Attorney, Agent, or Firm—Moonray Kojima

[57] ABSTRACT

In a nuclear magnetic resonance imaging device, a pulse sequence is selected and a variance or standard deviation of a calculated image for T1, T2, $\rho$ is determined as a function of scan parameters from the theoretical equation of signal intensity in the pulse sequence and the variance in the values for T1, T2, $\rho$ to be measured and the original image. Scan parameters, with which the total sum of variance or standard deviation of the calculated image takes a minimum value, are determined as optimum values. An image is obtained from the optimum scan parameters to obtain a plurality of original images. A calculated image for T1, T2, $\rho$ is determined, based on the original images, whereby a calculated image of high quality is simultaneously obtained.

29 Claims, 11 Drawing Figures

FIG. 8 IRSE Method

FIG. 9 FR4SE Method

NUCLEAR MAGNETIC RESONANCE IMAGING DEVICE

BACKGROUND OF THE INVENTION

1. Field of Invention

This invention relates to a nuclear magnetic resonance (hereinafter called "NMR") imaging device, and, more particularly, to such a device capable of determining optimum scan parameters and of obtaining an original image from the scan parameters, thereby to obtain a calculated image for the relaxation times T1, T2 and the proton density $\rho$.

2. Description of Prior Art

A prominent feature of an NMR image resides in the image density being provided as a function of the nuclei density $\rho$ (which is typically, proton $^1$H density), relaxation times T1, T2, pulse sequences, and scan parameters such as RF pulse intervals, so that images of various contrasts can be obtained by varying the measuring parameters and hence a variety of information regarding diseases, for example, can be obtained.

However, this makes the comparison between clinical data difficult and interferes with the objectivity seen in the image.

In a known method of taking an image, pulse sequences or scan parameters of high image contrast with diseases to be examined, are experimentally selected. Furthermore, for those diseases lacking in clinical examples, a plurality of images are obtained by varying the image taking conditions. The image taking conditions are used to provide image contrast which correspond to experimentally determined diseases. However, such a method of accumulating clinical data is inefficient, and brings about significant practical problems in that scanning has to be made under various image taking conditions as occurs in actual clinical data cases. Also, it is nearly impossible for the scanning to be capable of obtaining an image of optimum contrast for a disease lacking in past clinical data.

There is also known a method of determining a calculated image for T1, T2 and $\rho$ through calculation from two or more images obtained by varying the condition of pulse application. However, since the method of evaluating the pulse sequence or scan parameter is not clear, when obtaining an original image for the calculated image of T1, T2, $\rho$, using this method, calculation for T1, T2, $\rho$ is not always performed under optimum conditions.

Another method has been used to obtain a pure calculated image for T1, T2, $\rho$ having an objective meaning for diagnosis through inter-image computation from a plurality of NMR images. However, since the calculated images for T1, T2, $\rho$ at present are poor in signal to noise (S/N) ratio, accuracy for the values of T1, T2, $\rho$ is not suitable for practical use.

SUMMARY OF THE INVENTION

Accordingly, an object of the invention is to overcome the aforementioned and other deficiencies and disadvantages of the prior art.

Another object is to provide an NMR imaging device which is capable of obtaining optimum scan parameter values, relative to the values for T1, T2, $\rho$, which are determined by computation, and which is capable of determining highly accurate image for T1, T2, $\rho$ simultaneously through computation from a plurality of images obtained by taking an image based on the thus determined scan parameter.

A further object is to provide an NMR imaging device wherein an image for a certain disease, for example, is obtained based on scan parameters capable of giving a highly accurate calculated image for T1, T2, $\rho$ obtained by this device thereby shortening the scanning time, while an image having an image contrast effective for diagnosis and having an objective visual effect can be reconstituted through computation by using the thus obtained calculated image for T1, T2, $\rho$.

DETAILED DESCRIPTION OF PREFERRED EMBODIMENTS

I. NMR IMAGING DEVICE

Figure 1:
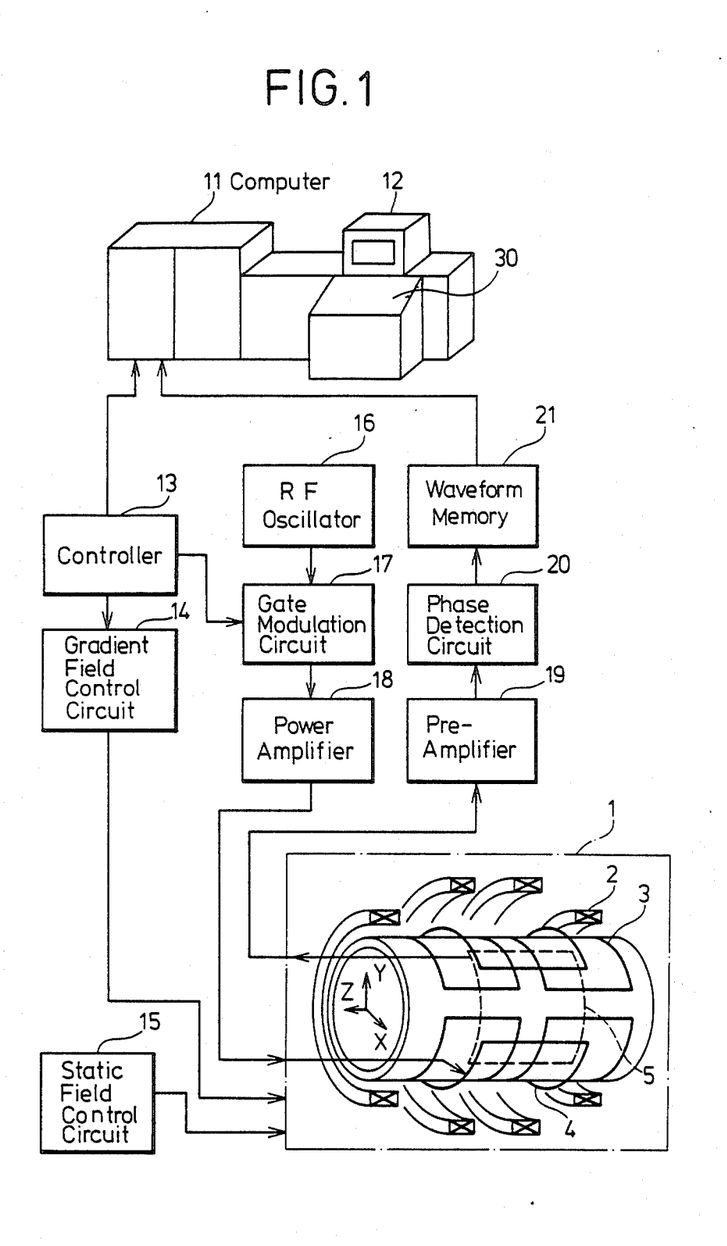
FIG. 1 is a schematic view depicting an illustrative embodiment of the invention.

FIG. 1 depicts a portion of an illustrative NMR imaging device wherein a magnet assembly 1 has an inside space portion (i.e. a hollow cylindrical hole) for placing an object to be examined. Around the space portion are arranged a main field coil 2 for applying static magnetic field Ho uniformly to the object, gradient field coils 3 for generating gradient magnetic fields (comprising x-gradient field coil, y-gradient field coil and z-gradient field coil arranged to individually produce gradient magnetic fields), an RF transmission coil 4 for applying RF pulses to excite the spin of the nuclei within the object and a receiving coil 5 for detecting the NMR signals from the object.

The main field coil 2 is connected to a static field control circuit 15. Each of the gradient field coils Gx, Gy, Gz is connected to gradient field control circuit 14. RF transmission coil 4 is connected to a power amplifier 18. NMR signal receiving coil 5 is connected to a preamplifier 19.

A controller 13 controls the sequence of generating the gradient magnetic fields, via circuit 14, and the RF magnetic field, via oscillator 16, circuit 17, and amplifier 18, for performing scanning with a pulse sequence designated from an operation console 30 and with optimized scan parameters. The controller 13 also conducts required control for storing NMR signals obtained, via preamplifier 19, circuit 20, into a waveform memory 21.

A gate modulation circuit 17 suitably modulates RF signals outputted from an RF oscillator 16 under control of controller 13, to produce RF pulses at a predetermined phase. RF pulses are applied through an RF power amplifier 18 to RF transmission coil 4. A preamplifier 19 amplifies NMR signals obtained from detection coil 5. A phase detection circuit 20 conducts phase detection of the preamplified NMR signals, while referring to the output signals from the RF oscillator and supplies the phase detected signals to the waveform memory 21 which stores the phase detected waveform signals. Either memory 21 or phase detection circuit 20 may be provided with an analog to digital (A/D) converter.

A computer 11 is adapted to receive signals from waveform memory 21 and to apply a predetermined processing to the signals thereby obtaining a tomographic image. Computer 11 can also perform various functions, such as optimization of scan parameters, computation for the calculated image, etc, as desired. Details of such functions will be discussed further hereinbelow.

An operation console 30 has keys or other input means for inputting various kinds of information, such as values for T1, T2, ρ to be noted, pulse sequence and scan parameters employed, etc. The input information are suitably supplied to computer 11, controller 13, gradient field control circuit 14 and static field control circuit 15, etc.

A display unit 12 has a display device, such as a television monitor, which is adapted to display various desired data or images, such as information inputted from operation console 30 or tomographic images determined by computer 11.

The portions referred to as control and computation means in this invention indicate those means which have a control function or computation function, such as in controller 13 and computer 11.

A calculated image is obtained in the illustrative embodiment in the following manner. A pulse sequence to be selected is designated and values for T1, T2, ρ to be noted, are inputted from operation console 30. Computer 11 determines optimum scan parameters (Ts1, Ts2, ...), sampling time and average number of images, by computations based on the designated pulse sequence and the values for T1, T2, ρ, so that a calculated image for T1, T2, ρ, of an object to be determined, is a highly accurate image. The details of such computation will be discussed hereinbelow.

Figure 2:
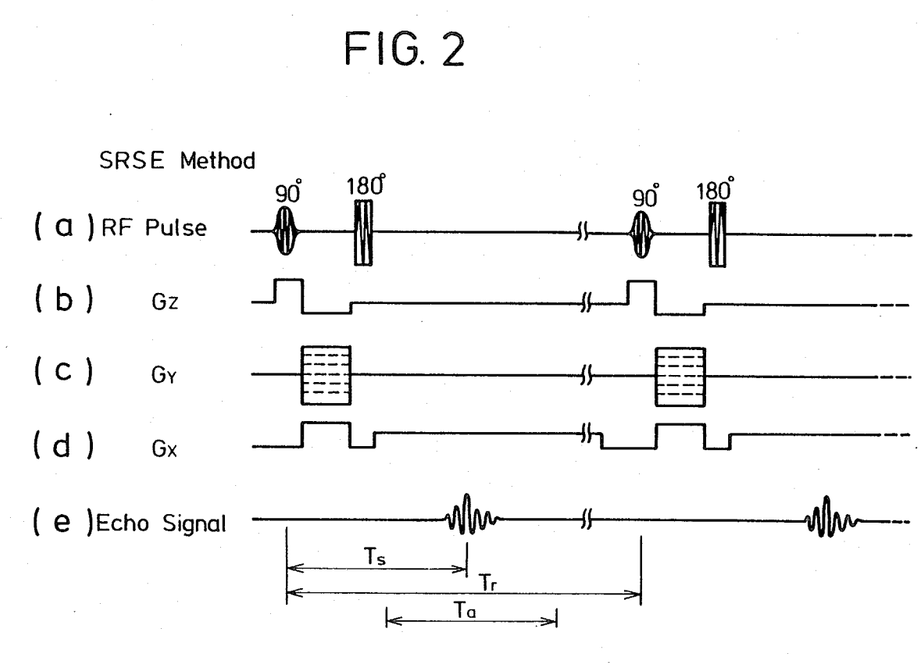
FIGS. 2 THROUGH 9 are charts depicting different pulse sequences as used in the embodiment.

Then, imaging procedures by the designated pulse sequence will be discussed in connection with a saturation recovery method (SR method) and a spin echo method (SE method), hereinafter referred to simply as "SRSE method". FIG. 2 shows the pulse sequence for such a procedure.

NMR signals are observed while actuating static field control circuit 15 and applying static magnetic fields to an object placed in the spaced portion of the magnetic assembl 1, as described below.

By controlling gate modulation circuit 17 using controller 13, 90° pulses (shown in FIG. 2, line (a)) are obtained from the output signals of RF oscillator 16. The 90° C. pulses are applied by way of power amplifier 18 to RF transmission coil 4, to excite the object in the magnetic assembly 1. Simultaneously, the z-gradient field coil is driven, via gradient field control circuit 14, to drive the z-gradient field coil to apply gradient magnetic field Gz (shown in FIG. 2, line (b)) to selectively excite the spins within a specific sliced plane of the object.

Then, as shown in FIG. 2, line (c), the y-gradient field coil is driven, by way of gradient field control circuit 14, to apply a gradient magnetic field Gy to perform phase encoding. At the same time, the x-gradient field coil is driven, by way of gradient field control circuit 14, to apply the gradient magnetic field Gx (shown in FIG. 2, line (d)), to prepare for observation of echo signals. In this case, a negative gradient magnetic field Gz is applied so as to coincide the phases of the NMR signals from different portions of the object.

After the elapse of a predetermined amount of time, application of all of the gradient magnetic fields is interrupted. 180° pulses are then generated by gate modulation circuit 17 and oscillator 16 to drive RF transmission coil 4, via power amplifier 18. The 180° pulses are thus applied to the object to inversely offset the spins under variance. The period from the application of the 90° pulses to the application of the 180° pulses is about one half of the scan parameter Ts, determined by computer 11, as described above, and its time control is conducted by controller 13.

After applying the 180° pulses, the x-gradient field coil is driven and while applying the gradient magnetic field Gx (shown in FIG. 2, line (d)) echo signals which are consequently generated are detected by receiving coil 5. As shown in FIG. 2, line (e), the peak in the echo signal appears just after the time Ts as a result of application of the 90° pulse. The sampling time for measuring the echo signals by the receiving coil 5, has a time slot Ta with the peak in the echo signals as the center (shown in FIG. 2, line (e)).

The spin echo signals received by receiving coil 5 are introduced, by way of preamplifier 19, to phase detection circuit 20, whereat they are subjected to phase detection and analog-to-digital conversion and then stored in memory 21. The A/D converter may also be a part of the memory 21 instead.

The echo signals thus obtained correspond to one line for a 2-dimensional Fourier transformation regarding the spin density distribution within the sliced plane. Accordingly, generated echo signals are observed while varying the magnitude of the gradient magnetic field Gy, that is, the magnitude of the phase encoding of each of a plurality of views, and repeating the application of RF pulses and gradient magnetic fields in the same manner described above. In this case, the repeating time interval, that is, the time Tr is controlled by controller 13.

After the echo signals have been measured and stored over the entire plurality of views, a reconstituted image for the sliced plane of the object (hereinafter referred to as an original image) can be determined by computer 11 conducting a two dimensional inverse Fourier transformation for the echo data.

In this manner, an original image can be obtained when it is assumed that the designated scan parameters are Ts, Tr and the sampling time is Ta, in the SRSE method. If the average number of images is N, the above mentioned operation is repeated N times to obtain N original images, from which then an arithmetic mean is calculated to obtain an original image.

In the embodiment, since three or more original images with different pulse sequences or scan parameters are used, a plurality of original images are obtained by the same operation as described above using other designated pulse sequences or scan parameters, respectively.

Although the imaging operation has been described with regard to the SRSE method, imaging operation can be carried out also using other types of pulse sequences by other methods.

A calculated image for T1, T2, ρ, can be determined by computer 11 using the calculation method described below and using the thus obtained original image.

II. METHOD OF CALCULATING FOR T1, T2, ρ, IMAGE

The signal intensity i for one picture element in an NMR image is a function of T1, T2, ρ, and scan parameter (P=Tr, Ts, ...), as shown below.

$$i = f(T1, T2, \rho, P) \quad (1)$$

Accordingly, value for T1, T2, ρ, on each picture element can be calculated by the method of the least square from three or more images while varying the pulse sequence or scan parameters. Since equation (1) is in a non-linear form, it is subjected to Taylor developement around an approximate value Xo=(T10, T20, ρ0) for application of the method of the least square and developed terms are taken up to the primary term into equation (2) as follows.

$$i = f(X_o, P) + \left(\frac{\partial f}{\partial T_1}\right) \cdot \Delta T_1 + \left(\frac{\partial f}{\partial T_2}\right) \cdot \Delta T_2 + \left(\frac{\partial f}{\partial \rho}\right) \cdot \Delta \rho \tag{2}$$

Assuming the number of images used for the calculation is n, and the signal intensity, the signal intensity formula and the scan parameters of the resepctive images are i1-in, f1-fn and P1-Pn, respectively, the, the following equation (3) is established from equation (2).

$$i = f_o + A \cdot \Delta X \tag{3}$$

wherein $$i = \begin{pmatrix} i_1 \\ \vdots \\ i_n \end{pmatrix} \quad f_o = \begin{pmatrix} f_1(X_o, P_1) \\ \vdots \\ f_n(X_o, P_n) \end{pmatrix} \quad \Delta X = \begin{pmatrix} \Delta T_1 \\ \Delta T_2 \\ \Delta \rho \end{pmatrix}$$

$$A = \begin{pmatrix} \frac{\partial f_1}{\partial T_1}, & \frac{\partial f_1}{\partial T_2}, & \frac{\partial f_1}{\partial \rho} \\ \vdots & \vdots & \vdots \\ \frac{\partial f_n}{\partial T_1}, & \frac{\partial f_n}{\partial T_2}, & \frac{\partial f_n}{\partial \rho} \end{pmatrix}$$

Assuming the signal intensity of the actually taken image is $I = (I_1, \ldots I_n)^T$, since equation (3) is in a linear form, $\Delta X$, which minimizes a square error between I and i can be calculated. A new approximate value X1 is calculated by following equation (4), and then, X1 is substituted for X0 with repeated calculations until $\Delta X$ is convered to a desired value.

$$X1 = X0 + \Delta X \tag{4}$$

The values for T1, T2, ρ, for one picture element are determined by the above procedure and an image for T1, T2, ρ, can be determined by conducting computations for all of the picture elements.

III. OPTIMIZATION OF SCAN PARAMETERS

The calculated values for T1, T2, ρ, have a variance, for the effects of noises, from the original image. It is necessary to reduce the variance in order to obtain a calculated image of high accuracy. A covariance matrix $C_{T1, T2, \rho}$ for the values of T1, T2, ρ, calculated by the method of the least square, can be calculated by the following equation (5), based on the law of error propagation.

$$C_{T1, T2, \rho} = (A^T \cdot C_{image} \cdot A)^{-1} \tag{5}$$

wherein $$C_{T1T2\rho} = \begin{pmatrix} \sigma^2 T_1, & \sigma^2 T_1 T_2, & \sigma^2 T_1 \rho \\ \sigma^2 T_1 T_2, & \sigma^2 T_2, & \sigma^2 T_2 \rho \\ \sigma^2 T_1 \rho, & \sigma^2 T_2 \rho, & \sigma^2 \rho \end{pmatrix} \quad C_{image} = \begin{pmatrix} \sigma^2 1 & & 0 \\ & \ddots & \\ 0 & & \sigma^2 n \end{pmatrix}$$

and further wherein $C_{image}$ is a covariance matrix for the original image (in which it is assumed that the variance $\sigma^2 i$ for each of the images is in an inverse proportion to the average number Ni and the sampling time Tai and that there is no noise correlation between the images) and A represents a Jacobian matrix for the signal intensity formula of equation (3).

The sum of the normalized vairance, set forth below as equation (6), is used as an evaluation function for the calculated image.

$$E = \frac{\sigma^2 T_1}{T_1^2} + \frac{\sigma^2 T_2}{T_2^2} + \frac{\sigma^2 \rho}{\rho^2} \tag{6}$$

Although the normalized variances for T1, T2, ρ, are added each with identical weight into the evaluation function, in this case, they can be added as individually weighed.

If the pulse sequence used and the values for T1, T2, ρ, to be noted, are determined, $\sigma^2 T_1$, $\sigma^2 T_2$, and $\sigma^2 \rho$, are determined as the function of P1, Ni, Tai by equation (5). Accordingly, Pi, Ni and Tai for minimizing E and the value E can be calculated by the method of determining an extremal value of a multi-variant function under conditions wherein the total image time ($\Sigma Ni \cdot Tri$) is constant. Since the values for T1, T2, ρ, to be noted, actually have a certain range, the sum for the value E, at representative points within the range ($\Sigma E$) can be made to be minimized.

The optimum scan parameters Pi, Ni, Tai, can be determined by the method described hereinbelow.

The law of error propagation is described, for example, by S. Brandt, in "Statistical and Computaional Method in Data Analysis" published by North-Holland Publishing Company, (1976). In this calculation method, there is no particular restriction for the pulse sequences used. Furthermore, the variance of the calculated image can be reduced by increasing the number of images used for calculation. Accordingly, it is apparently advantageous to use a multiecho method which is capable of obtaining a plurality of images by one imaging operation.

As a result, of comparing the pulse sequences used, it has been found that the combination of IR (m-1) SE method and the SRmSE method (m represents an even number) is most appropriate in view of calculation accuracy and system error. While it is generally better to increase the number of echoes and the number of images, the number of echoes is actually restricted in view of the accuracy of the 180° pulses. The values for the evaluation function ($\Sigma E$) for the combination of respective pules sequences are shown in FIG. 10.

For the calculation of $\Sigma E$ value, 7 points in Table 1, below, are used as representative points of values for T1, T2, ρ, in a human body and the entire imaging time is set at 10 minutes.

Figure 10:
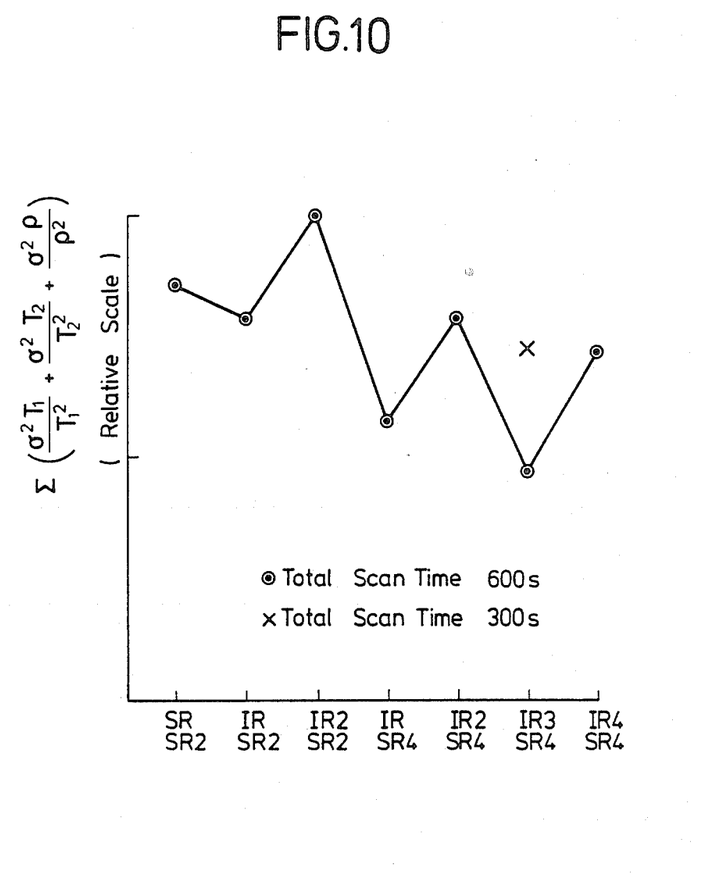
FIGS. 10 and 11 are graphs depicting the sum of the variances normalized relative to each other in the combination of the IRnSE and SRmSE methods.
Figure 11:
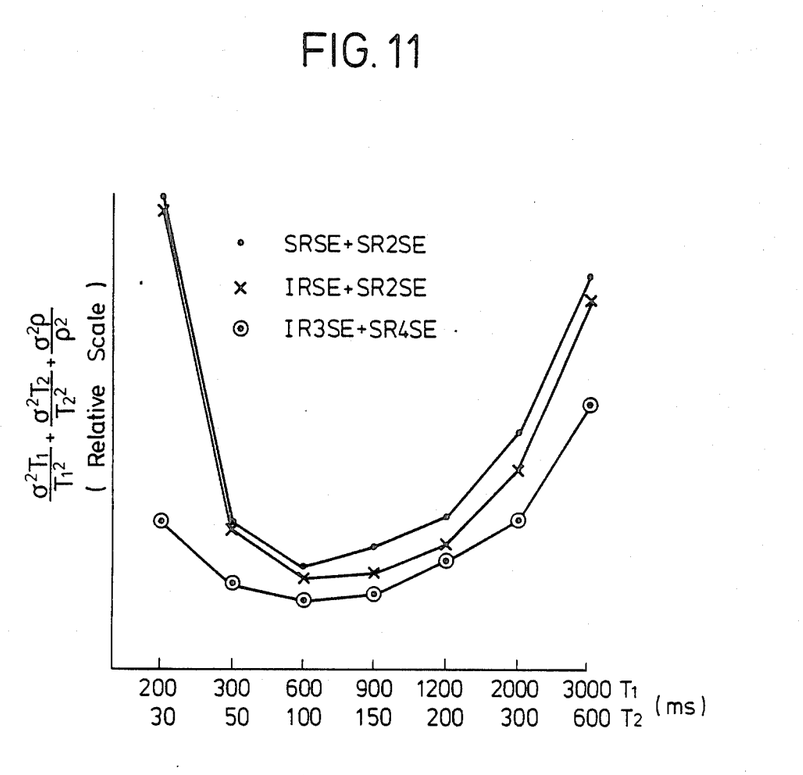

It can be seen from FIG. 10 that the combination of the IR3SE method and the SR4SE method is optimum in which a calculated image with a similar level to that of the IRSE method and SR2SE method can be obtained if the total imaging time is reduced to one half, that is, 5 minutes. E values for each of the points (T1, T2, ρ) are ploted in FIG. 11 for the combination of SRSE method and SR2SE method, IRSE method and SR2SE method, and IR3SE method and SR4SE method. By increasing the number of images using the multiecho process, calculated values with reduced variance can be obtained within a broad range for the values T1, T2.

TABLE 1

| (T1(ms), T2(ms), ρ) | | | |
|---|---|---|---|
| (200, 30, 1) | (300, 50, 1) | (600, 100, 1) | (900, 150, 1) |
| (1200, 200, 1) | (2000, 300, 1) | (3000, 600, 1) | |

The optimization for the scan parameters can be calculated both internally and externally by using a separate device wherein only the optimum scan conditions obtained are stored within the device and suitably utilized.

IV. CALCULATED IMAGE FROM THE COMBINATION OF IR3SE METHOD AND SR4SE METHOD

When calculating an image for T1, T2, ρ, from three images determined by the IR3SE method and four images determined by the SE4SE method, that is, seven images in total, the following takes place.

The IR3SE method gives a pulse sequence similar to the IRSE method (shown in FIG. 4) wherein 180° (2) pulses are applied repeatedly for three times in one view to obtain three echo signals. The SR4SE method gives a pulse sequence similar to the SRSE method (shown in FIG. 5) which is a multi-echo process of applying 180° (2) pulses for four times to obtain 4 echo signals per each view.

(IV-1) Pulse Sequences

Figure 4:
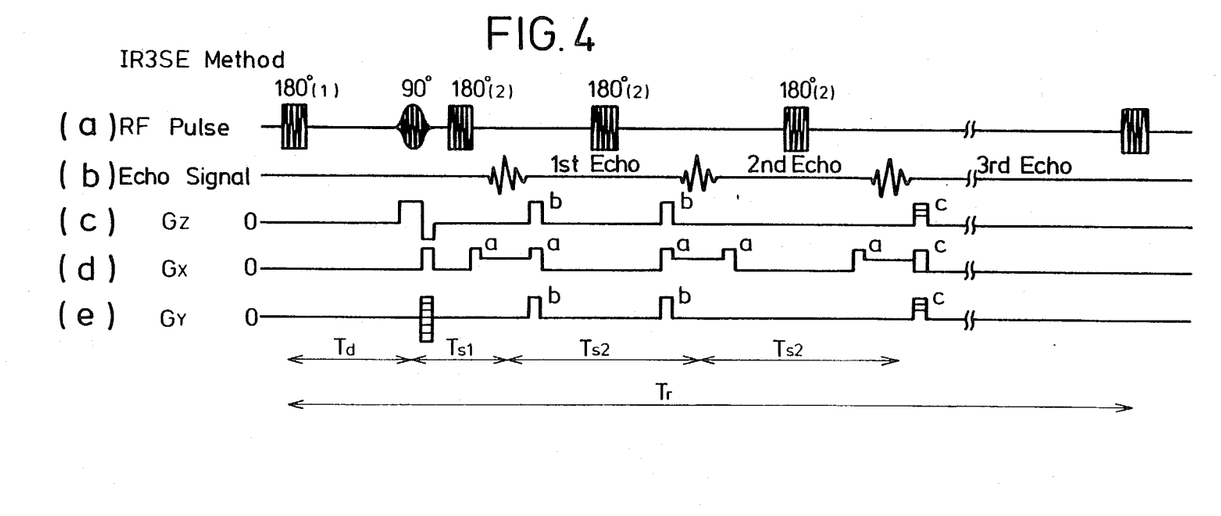
Figure 5:
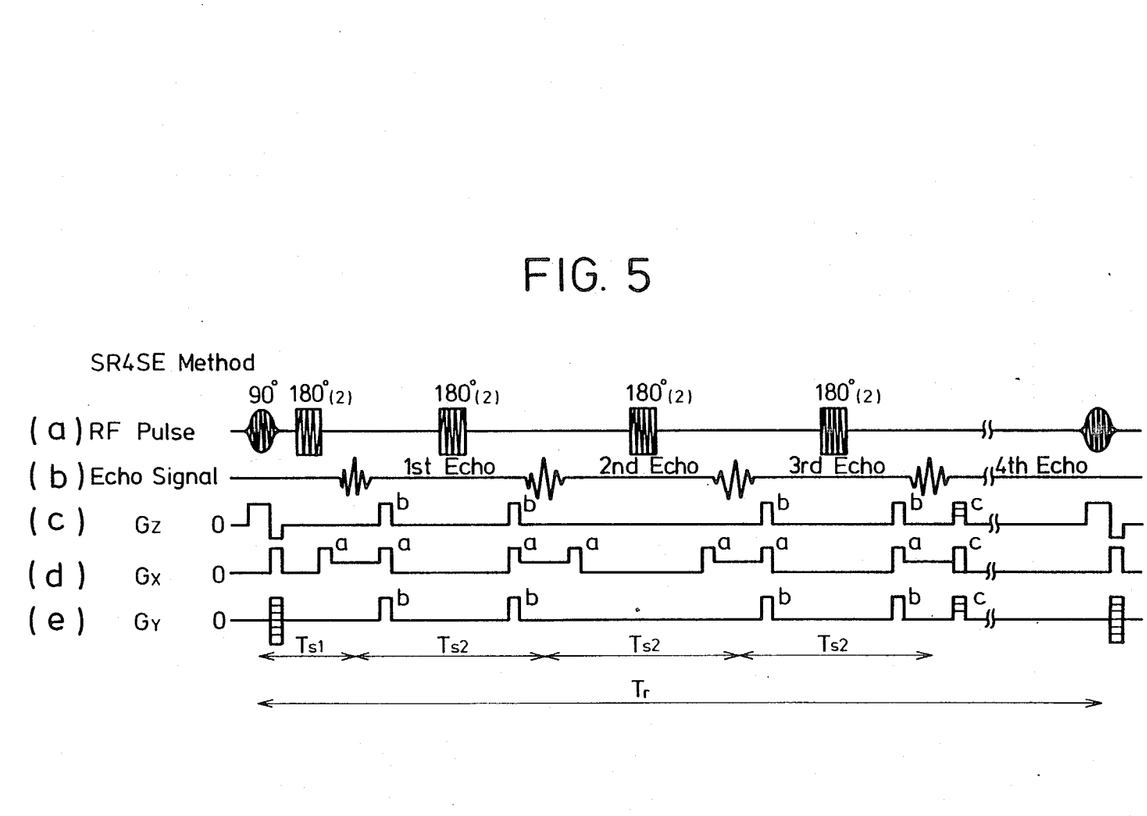

FIGS. 4 and 5 describe pulse sequences wherein interval Ts1 from 90° pulse (see line (a)) to the center of the first echo signal (line b)), center to center interval Ts2 between each of the echo signals after the first echo signal, interval Td from 180°(1) pulse to 90° pules (FIG. 4) and the repeating time Tr can all be optionally selected.

The timing control is provided by controller 13 (FIG. 1) and these times can be set manually or otherwise by using operation console 30.

The 180°(1) (see FIG. 4, line (a)) pulse is for spin inversion and 180°(2) pulse is for spin echo. These pulses can comprise composite pulses of 90°, −45°, 270°, 45°, 90°, −45° to reduce pulse errors. The number of 180° pulses on each view is an even number both in the IR3SE method and the SR4SE method. The suffix value (−45,45) attached to the degree of composite pulses represents the phase difference with respect to the exciting 90° pulses and these pulses are non-selective pulses. The exciting 90° pulses are selective pulses and sine modulated. The gradient magnetic field Gx in the direction x is a projection gradient and a (line (d)) is a spoiler for eliminating noises from the sliced plane due to 180° pulses.

The z-direction gradient magnetic field Gz is a slicing gradient, the y-direction gradient magnetic field Gy is a warp gradient and b (lines (c)(e)) represents a spoiler for eliminating artifact due to 180° pulse error. Also, c (lines (c)(d)(e)) represents a spoiler for eliminating correlation between the views. Application of each of the gradient magnetic fields is controlled by controller 13.

Each of the echo signals generated by the pulse sequence, as mentioned above, is detected by receiving coil 5. The spin echo signal detected by receiving coil 5, is applied, by way of preamplifier 19 and phase detector 20, and stored in waveform memory 21.

(IV-2) Signal Intensity Formula

IV-2A. The signal intensity formula in the IR3SE method is represented by the following $$Io = C_{IR3}(T1/Tr) \cdot [1 - 2^{exp}(-Td/T1) + 2^{exp}(-Tr/T1 + Ts1/T1 + 3Ts2/2T1) - 2^{exp}(-Tr/T1 + Ts1/T1 + Ts2/2T1) + 2^{exp}(-Tr/T1 + Ts1/2T1) - exp(-Tr/T1)] \cdot \rho \quad (7)$$

wherein the first echo is $Io \cdot exp(-Ts1/T2)$; the second echo is $Io \cdot exp(-Ts1/T2 - Ts2/T2)$; and the third echo is $Io \cdot exp(-Ts1/Ts - 2Ts2/T2)$.

IV-2B. The signal intensity formula in the SR4SE method is represented by the following $$Io = C_{SR4}(T1/Tr) \cdot [1 - 2^{exp}(-Tr/T1 + Ts1/T1 + 5Ts2/2T1) + 2^{exp}(-Tr/T1 + Ts1/T1 + 3Ts2/2T1) - 2^{exp}(-Tr/T1 + Ts1/T1 + Ts2/2T1) + 2^{exp}(-Tr/T1 + Ts1 + 2T1) - exp(-Tr/T1)] \cdot \rho. \quad (8)$$

wherein the first echo is $Io \cdot exp(-Ts1/T2)$; the second echo is $Io \cdot exp(-Ts1/T2 - Ts2/T2)$; the third echo is $Io \cdot exp(-Ts1/T2 - 2Ts2/T2)$ and the fourth echo is $Io \cdot exp(-Ts1/Ts2 - 3Ts2/T2)$.

In this case, $C_{IR3}$, and $C_{SR4}$ are functions representing effects of the slice configuration and can be determined in the following manner. The signal intensity formula, not including the effect of the slicing configuration, is defind as follows.

$$Fn(TR, Ts, T1, T2, \rho) \quad (9)$$

The signal intensity, when the magnetization is turned by an angle α by the 90° pulse, is represented by the following.

$$\frac{\sin\alpha}{H\cos\alpha \cdot exp(-Tr/T1)} \cdot Fn(Tr, Ts, T1, T2, \rho) \quad (10)$$

in the case where the pulse sequence comprises one 90° pulse and an odd number of 180° pulses.

When Caussian 90° pulses are used, the angle α° at the point which is a distance z from the slice center is represented by the following.

$$\alpha = (\pi/2) \exp(-Z^2) \quad (11)$$

When equation (10) is integrated with z by equation (11), a signal intensity, including the effect of the slice configuration, is determined as shown by the following equation.

$$Fn(Tr, Ts, T1, T2, \rho) \int \frac{\sin\{(\pi/2)\exp(-Z^2)\}}{H\cos\{(\pi/2)\exp(-Z^2)\}\exp(-Tr/T1)} dZ \quad (12)$$

Since the integration part of equation (12) is a function only of (T1/Tr), the value is written as $C_{odd}$ (T1/Tr). Since $C_{odd}$ is a function of T1/Tr, it is possible to determine $C_{odd}$ through numerical integration within the necessary range of T1/Tr and determine $C_{odd}$ from the value as a polynomial of T1/Tr.

$C_{odd}$ can be represented by using a spline function as shown below:

In the case of $0 < T1/Tr \leq 1$
  $+0.2093 \cdot (T1/Tr)^3$
  $-0.3685 \cdot (T1/Tr)^2$
  $+0.0242 \cdot (T1/Tr)$
  $+1.0018$ In the case of $1 < T1/Tr \leq 3$
  $-0.0423E - 1 \cdot (T1/Tr)^3$
  $+0.4302E - 1 \cdot (T1/Tr)^2$
  $-0.1582 \cdot (T1/Tr)$
  $+0.9862$.

In the case of $3 < T1/Tr \leq 10$
  $-0.1475E - 3 \cdot (T1/Tr)^3$
  $+0.3650E - 2 \cdot (T1/Tr)^2$
  $-0.3224E - 1 \cdot (T1/Tr)$
  $+0.8524$ From the foregoing, the signal intensity formula Fs(Tr,Ts,T1, T2, ρ), including the effect of slice configuration, can be determined as a product of Fn and coefficient $C_{odd}$ representing the effects of slice configuration, as follows.

$$Fs(Tr, Ts, T1, T2, \rho) = Fn(Tr, Ts, T1, T2, \rho) C_{odd}(T1/Tr) \quad (13)$$

When the pulse sequence comprises one 90° pulse an even number of 180° pulses, and assuming the signal intensity formula, not including the effect of slice configuration is Fn, the signal intensity where the magnetization is turned by an angle α° is represented by the following.

$$\frac{\sin \alpha}{1 - \cos\alpha \cdot \exp(-Tr/T1)} \cdot Fn \quad (14)$$

It can be calculated in the same manner as above. For example, by using Gaussian 90° pulses, the coefficient $C_{even}$ representing the effect of slice configuration can be represented as follows.

In the case of $0 < T1/Tr \leq 1$
  $-0.2263 \cdot (T1/Tr)^3$
  $+0.5320 \cdot (T1/Tr)^2$
  $-0.0805 \cdot (T1/Tr)$
  $+1.0010$ In the case of $1 < T1/Tr \leq 3$.
  $+0.0030E - 1 \cdot (T1/Tr)^3$
  $+0.2718E - 1 \cdot (T1/Tr)^2$
  $+0.3582 \cdot (T1/Tr)$
  $+0.8949$ In the case of $3 < T1/Tr \leq 10$
  $+0.5496E - 3 \cdot (T1/Tr)^3$
  $-1.7146E - 2 \cdot (T1/Tr)^2$
  $+2.0117E - 1 \cdot (T1/Tr)$
  $+0.9988$ By using the signal intensity formula, including the effects of slice configuration thus determined, the system error due to the slice configuration can be eliminated.

Since both of the numbers of 180° pulses are even numbers, both in the IR3SE method and in the SR4SE method, the following relationship is established.

$$C_{IR3} = C_{SR4} = C_{even} \quad (15)$$

Although calculations were made using Gaussian 90° pulses, the same calculations can be made using other 90° pulses provided that the angle α° of the magnetization turned by the 90° pulses at the point which is a distance z from the center of the slice, can be determined.

IV-2C System error due to the 90° pulse error. If the 90° pulses are shifted to β° pulses, due to the unevenness in the RF pulses or the like, the obtained signal intensity can be determined by integrating equation (10) or equation (14) with z by equation (16) in the same manner as described in paragraph IV-2B, hereinabove.

$$\alpha = \beta \cdot \exp(-Z^2) \quad (16)$$

Assuming the coefficient representing this effect is $C_\beta$, $C_\beta$ is a function only for (T1/Tr) in the same manner as $C_{odd}$, $C_{even}$, and the configuration thereof is determined whether the number of 180° pulses is even or odd.

Since the number of 180° pulses are even in number in both the case of the IR3SE method and in the SR4Se method, the $C_\beta$ for the IR3SE method and for the SR4SE method agree with each other. Accordingly, the effect due to the 90° pulse error is the multiplication of C to all of the images, and the effect on the calculated values for T1, T2, ρ, is only the multiplication of $C_\beta$ for the value ρ. Thus, system error, due to the 90° pulse error, which affects the values for T1,T2, can be eliminated by equalizing the values for Tr between IR3SE and SR4SE methods.

Another effect produced by equalizing the Tr is as follows. Since the coefficient $C_{even}$ representing the effect of slice configuration also agrees between IR3SE and SR4SE methods, the system error due to the slice configuration is also caused only by multiplication of the value of ρ with the $C_{even}$. Accordingly, it is not required to determine the value of ρ with high accuracy, a usual signal intensity formula, not including the effect of slice configuration, may be used. Also, it is effective when the slice configuration is not known.

IV-2D Optimization of scan parameters. Scan parameters which are capable of optimizing the evaluation function of the calculated image for T1, T2, ρ, of a human body is calculated by the law of error propagation. The signal intensity formula described in above paragraph IV-2B is used.

The scan parameters that optimize the evaluation function for the calculated image may be determined from the theoretical equation of signal intensity and the range of values for T1, T2, ρ, to be noted. In this case, the sum of the normalized variance is used as the evaluation function, that is $$\Sigma\{\sigma^2 T1/T2^2 + \sigma^2 T2 T2^2 + \sigma^2 \rho/\rho^2\} \quad (17)$$

wherein $\sigma^2 T1, \sigma^2 T2, \sigma^2 \rho$ represent the variance for T1, T2, ρ and Σ represents the sum of 7 points in Table 1.

Assuming the scan parameters for seven images as P1, P2, ... P7 and the signal intensity formulas as F1, F2, ... F7, for 7 images, the co-variance matrix $V_{T1, T2, \rho}$ for the values for T1, T2, ρ, calculated from the images by the method of the least square, is represented as follows.

$$V_{T1,T2,\rho} = (A^T V_{123}^{-1} A)^{-1} \quad (18)$$

wherein $V_{123}$ represents the co-variance matrix for the original image, the variance $\sigma^2$ for the original image is represented by by $\sigma^2 \alpha N^{-1} Ta^{-1}$, assuming the average number of times N and the sampling time is Ta, while A is represented by the following.

$$A = \begin{pmatrix} \left(\frac{\partial F1}{\partial T1}\right)_{P_1 T_1 T_{2p}}, & \left(\frac{\partial F1}{\partial T2}\right)_{P_1 T_1 T_{2p}}, & \left(\frac{\partial F1}{\partial \rho}\right)_{P_1 T_1 T_{2p}} \\ \left(\frac{\partial F2}{\partial T1}\right)_{P_2 T_1 T_{2p}}, & \left(\frac{\partial F2}{\partial T2}\right)_{P_2 T_1 T_{2p}}, & \left(\frac{\partial F2}{\partial \rho}\right)_{P_2 T_1 T_{2p}} \\ \vdots & \vdots & \vdots \\ \left(\frac{\partial F7}{\partial T1}\right)_{P_7 T_1 T_{2p}}, & \left(\frac{\partial F7}{\partial T2}\right)_{P_7 T_1 T_{2p}}, & \left(\frac{\partial F7}{\partial \rho}\right)_{P_7 T_1 T_{2p}} \end{pmatrix}$$

Accordingly, the variance of value from T1, T2, $\rho$, is determined as orthogonal elements for $T_{T1, T2, \rho}$. Thus, the evaluation function for the calculated image is determined as the function of P1, P2, ... P7, Ta1, Ta2 ... Ta7, N1, N2, ... N7.

Based on the above principle, suitable scan parameters can be determined by the following procedure.

(1) The theoretical formula for the signal intensity is determined.

(2) The evaluation function for the calculated image is determined as the function of scan parameters, based on theoretical equation, range for T1, T2, $\rho$, to be measured and the variance of the original image.

(3) Since the evaluation function for the calculated image is determined as the multi-variant function of the scan parameters in paragraph IV-2B above, scan parameters capable of optimizing the evaluation function is determined by the method of determining an extremal value for the multi-variant function (e.g. simplex method or the like).

One example of the scan parameters thus determined is shown below. In this case, Tr is equalized between the IR3SE method and the SR4SE method.

(a) When the total scanning time is 600 seconds. In the IR3SE method, Tr=2.36 seconds, Td=0.579 seconds, Ts1=0.02 seconds, and Ts2=0.02 seconds, with the average number N being 1. In the SR4SE method, Tr=2.36 seconds, Ts1=0.02 seconds, and Ts2=0.079 seconds with the average number N being 1.

(b) When the total scanning time is 300 seconds. In the IR3SE method, Tr=1.18 seconds, Td=0.41 seconds, Ts1=0.02 seconds, and Ts2=0.02 seconds, with the average number N being 1. In the SR4SE method, Tr=1.18 seconds, Ts1=0.02 seconds and Ts2=0.074 seconds, with the average number N being 1.

IV-2E Image Obtained by Scan Parameters Described in Paragraph IV-2D above. In the IR3SE method, predetermined views (e.g. view number of 127) with warp gradients (i.e. gradient magnetic field Gy) which are different from each other are scanned by the parameters described above to measure the echo signals. The measured sampled signals are divided into each of first, second and third echo signal groups, and then reconstituted respectively into 2-dimensional images, to obtain three original images, by using computer 11.

In the SR4SE method, then, predetermined views (view number, for example of 127) with warp gradient (ie. gradient magnetic field Gy) being different from each other are scanned by the parameters described above to measure the echo signals in the same manner which are contained in memory 21. The obtained data are divided into each of first, second, and third echo signal groups, which are then reconstituted into 2-dimensional images, respectively, in the same manner by using computer 11, to obtain four original images.

IV-2F. An image for T1, T2, $\rho$ (i.e. calculated image) is determined by a non-linear method of the least square, using 7 original images obtained in paragraph IV-2E above, as determined by computation by computer 11.

In the foregoing methods, the mutual relationship between gradient magnetic fields Gx, Gy and Gz and slice, projection and warp can be determined as desired. With the above procedure, a calculated image for T1, T2, $\rho$, can be obtained accurately and simultaneously.

V. CALCULATED IMAGE FROM COMBINATION OF OTHER PULSE SEQUENCES

Examples of theoretical equations for signal intensity and optimized scan parameters when calculations are made using a combination of other pulse sequences are shown below.

(V-1) Determining a Calculated Image for T1, T2, $\rho$, from 3 Images by the SRSE Method.

V-1A The theoretical equation for the signal intensity is represented by the following.

$$F(Tr, Ts, T1, T2, \rho) = C_{SRSE} \cdot \exp(-Ts/T2) \{1 - 2 \cdot \exp(-Tr/T1 + Ts/2T1) + \exp(-Tr/T1)\} \cdot \rho \quad (19)$$

wherein $C_{SRSE}$ is a coefficient representing the effects of slice configuration.

V-1B The scan parameters are obtained by averaging the following (i), (ii), (iii) at a ratio of 1.4:1:1. (i) Tr=0.3 sec. Ts=0.022 sec. (ii) Tr=1.28 sec. Ts=0.025 sec. (iii) Tr=0.64 sec. Ts=0.109 Sec.; wherein Tr is time between each of the views, Ts is time from 90° pulse to the center of the echo signal.

Figure 3:
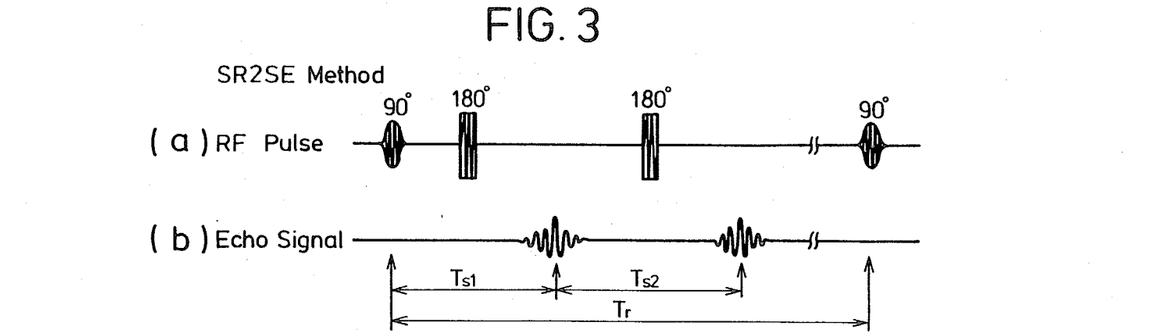

(V-2) Determining Image from Image in SRSE Method and SR3SE method of FIG. 3

V-2A The theoretical equation in the SRSE method is as follows.

$$C_{SRSE} \cdot \exp(-Ts/T2)\{1 - 2\exp(-Tr/T1 + Ts/2T1) + \exp(-Tr/T)\} \cdot \rho \quad (20)$$

The theoretical equation in the SR2SE method is as follows:

$$Mo = C_{SR2SE}\{1 - 2\exp(-Tr/T1 + Ts1/T1 + Ts2/2T1) + 2\exp(-Tr/T1 + Ts12/T1) - \exp(-Tr/T1)\} \cdot \rho \quad (21)$$

wherein the first echo is Mo·exp(−Ts1/T2); the second echo is Mo·exp(−Ts1/T2−Ts2/T2); and wherein $C_{SRSE}$ and $C_{SR2SE}$ are coefficients representing the effects of the slice.

V-2B The scan parameters are obtained by averaging the following (i), (ii) at a ratio of 1.8:1. (i) SRSE method, wherein Tr=0.34 sec., Ts=0.031 sec. and (ii) SR3SE method, wherein Tr=1.38 sec., Ts1=0.021 sec. and Ts2=0.09 sec., and wherein Tr is the time between each view, Ts1 is the time from the application of 90° pulse to the peak in the first echo signal and Ts2 is the time from the peak in the first echo signal to the peak in the second echo signal.

Since multi-echoes are used in the combined method of the the SRSE and SR2SE methods, a plurality of images can be obtained with one scan and the total scanning time can advantageously be shortened.

(V-3) Determining from 3 Images in FRSE Method

Figure 6:
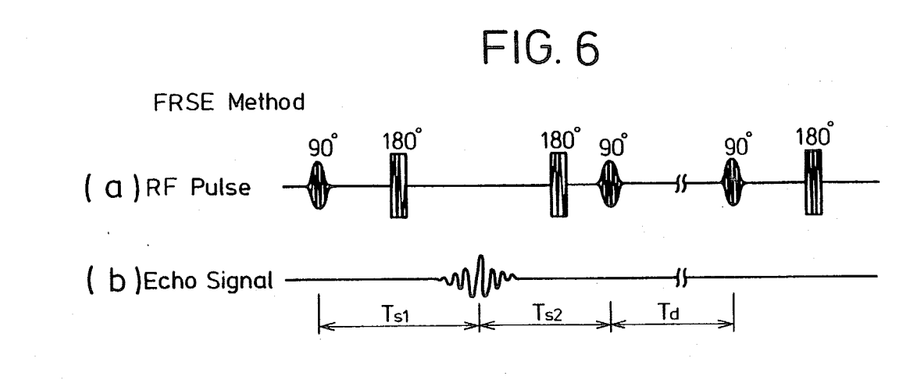

The FRSE method uses the pulse sequence shown in FIG. 6 wherein a fast recovery 90° pulse is applied after application of 180° pulse so as to shorten the waiting time until the transfer to the succeeding sequence. In this case the theoretical equation is as follows.

$$\exp(-Ts1/T2) \frac{1 - \exp(-Td/T1)}{1 - \exp(-Td/T1 - Ts1/T2 - Ts2/T2)} \cdot \rho \quad (22)$$

wherein Ts1 is the time from application of the 90° pulse to the peak point in the echo signal, Ts2 is the time from the peak point in the echo signal to application of the first recovery 90° pulse, Td is the time from this 90° pulse to the 90° pulse in the next sequence.

Then a calculated image is determined from 3 images, wherein assuming the total scan time is about 300 seconds and the number of views is 127, the scan parameters are determined as follows. (i) Tr=0.14 sec., Ts1=Ts2=0.023 sec., n=4; (ii) Tr=0.74 sec., Ts1=Ts2=0.016 sec., n=1; (iii) Tr=1.18 sec., Ts1=0.099 sec. Ts2=0.031 sec. and n=1.

(V-4) Determination of an Image from 3 Images in FRSE Method and FR2SE Method

Figure 7:
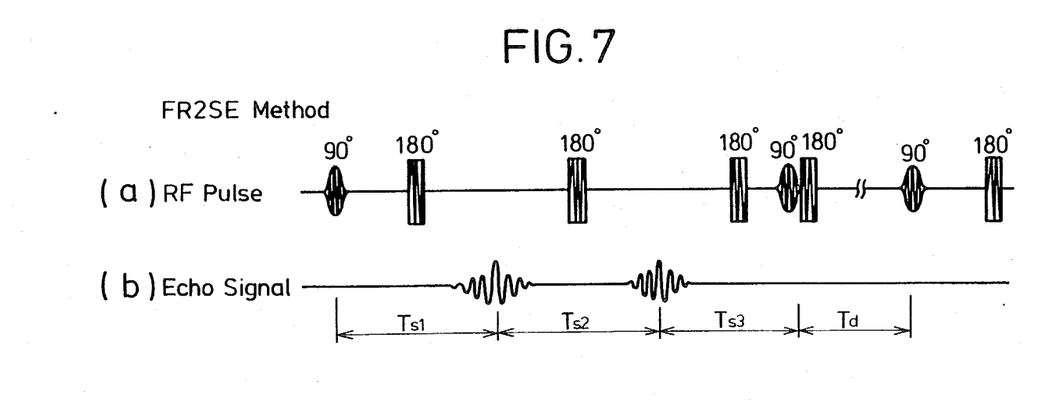

The FR2SE method uses the pulse sequence shown in FIG. 7, wherein one more 180° pulse is added for each of the views in the FRSE method shown in FIG. 6, so that every two sets of echo signals may be sampled. The calculated image is obtained by the two images due to the FR2SE method and one image due to the FRSE method shown in FIG. 6.

The theoretical equation of the signal intensity in the FR2SE method is as follows:

$$Mo = \frac{1 - \exp(-Td/T1)}{1 - \exp(-Td/T1 - Ts1/T2 - Ts2/T2 - Ts3/T2)} \cdot \rho \quad (23)$$

wherein the first echo is Mo·exp (−Ts1/T2); the second echo is Mo·exp (−Ts1/T2=Ts2/T2).

In this case, the scan parameters may be determined as described below by assuming the total scan time to be about 300 seconds, and the view number to be 127. Thus, (i) in the FRSE method, Tr=0.16 sec., Ts1=0.026 sec. Ts2=0.026 sec, and n=4; and (ii) in the RFR2SE method, Tr=1.62 sec., Ts1=0.021 sec., Ts2=0.081 sec., Ts3=0.031 sec. and n=1.

(V-5) Determinatio from 3 Images in the IRSE Method and the SR2SE Method

Figure 8:
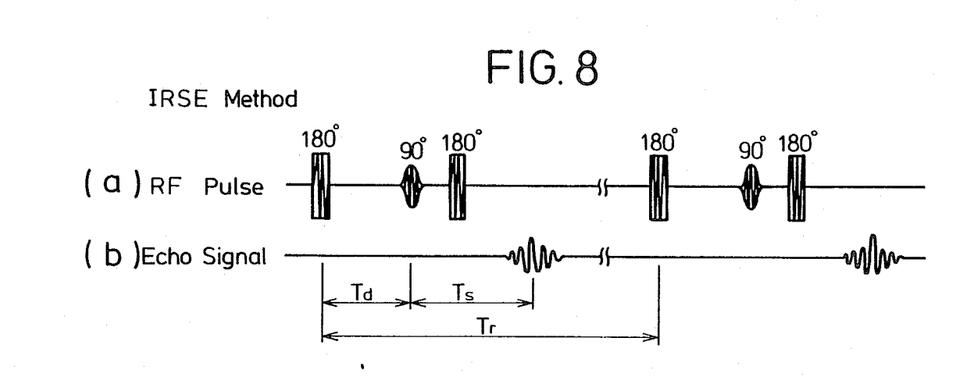

The theoretical equation of signal intensity in the IRSE method of pulse sequence, shown in FIG. 8, is represented by the following.

$$C_{IRSE} \cdot \exp(-Ts/T2)\{1 - 2 \cdot \exp(-Td/t1) + 2 \cdot \exp(-Tr/T1 + Ts/2T1) - \exp(-Tr/T1)\} \cdot \rho \quad (24)$$

wherein $C_{IRSE}$ is a coefficient representing effect of the slice, which is a function of T1/Tr.

When determining a calculated image from one image in the IRSE method and two images in the SR2SE method, the scan parameters can be determined in the manner as described below, assuming the total scan time to be about 300 seconds and the number of views to be 127. Thus, (i) in the IRSE method, Tr=1.2 sec., Td=0.23 sec., Ts=0.031 sec. and n=1; and (ii) in the SR2SE method, Tr=0.6 sec., Ts1=0.018 sec., Ts2=0.089 sec., and n=2.

(V-6) Determination of a Calculated Image from One Image in IRSE Method and two Images from the FR2SE Method In this procedure, the scan parameters are determined as follow, assuming the total scan time to be about 300 seconds, and the number of views to be 127. Thus, (i) in the IRSE method, Tr=1.16 sec., Td=0.221 sec., Ts=0.031 sec., and n=1; and (ii) in the FR2SE method, Tr=0.82 sec., Ts1=0.018 sec., Ts2=0.092 sec., Ts3=0.031 sec., and n=2.

In using the pulse sequences of the IRSE method, all of the advantages of such method accrue, such as the variance of T1 is reduced.

Figure 9:
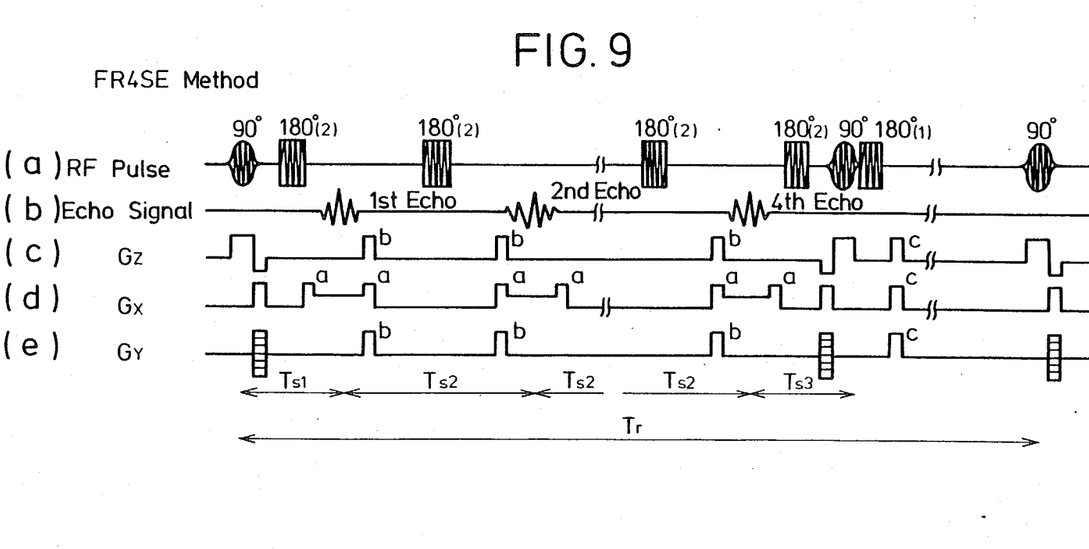

(V-7) Determination of a Calculated Image by Combination of IR Method and FR Method In this procedure, a calculated image for T1, T2, ρ, may also be determined from (n+m) original images from the IRnSe method (wherein n is an integer) and from the FRmSE method (wherein m is an integer). More particularly, when combining the IR3SE method, shown in FIG. 4, and the FR4SE method shown in FIG. 9, the image is determined as described below.

V-7A. Signal Intensity Formula. The signal intensity formula in the IR3SE method is as follows.

$$Io = C_{IR3}(T1/Tr)\{1 - 2\exp(-Td/T1) + 2\exp(-Tr/T1 + Ts1/T1 + 3Ts2/2T1) - 2\exp(-Tr/T1 + Ts1/T1 + Ts2/2T1) + 2\exp(-Tr/T1 + Ts1/2T1) - \exp(-Tr/T1)\} \cdot \rho \quad (25)$$

wherein the first echo is Io·exp (−Ts1/T2); the second echo is Io·exp (−Ts1/T2−Ts2/T2); and the third echo is Io·exp (−Ts1/T2−2Ts2/T2); and wherein $C_{IR3}$ is a function representing the effect of slice configuration.

The signal intensity formula in the FR4SE method is as follows.

$$Io = [1 - \exp\{-(Tr-Ts1-3Ts2-Ts3)/T1\}] \cdot \rho / [1 - \exp\{-(Tr-Ts1-3Ts2-Ts3)/T1 - (Ts1+3Ts2+Ts3)/T2\}] \quad (26)$$

wherein the first echo is Io·exp (−Ts1/T2); the second echo is Io·exp (−Ts1/T2−Ts2/T2); the third echo is Io·exp (−Ts1/T2−2Ts2/T2); and the fourth echo is Io·exp (−Ts1/T2−2Ts2/T2).

V-7B. Scan Parameters. When using a total scan time of 600 seconds the following are obtained. Thus, (i) in the IR3SE method, Tr=2.1 sec., Td=0.457 sec., Ts1=0.02 sec, and Ts2=0.02 sec. and average time (AVE)=1; and (ii) in the FR4SE method Tr=1.3 sec., Ts1=0.02 sec., Ts2=0.073 sec., Ts3=0.02 sec., and average time (AVE)=2.

When using a total scan time of 300 seconds, the following are obtained. Thus, (i) in the IR3SE method, Tr=1.28 sec., Td=0.366 sec. Ts1=0.02 sec., Ts2=0.02 sec., and average time (AVE)=1; and (ii) in the FR4SE method, Tr=1.1 sec., Ts1=0.02 sec., Ts2=0.073 sec., Ts3=0.02 sec., and average time (AVE)=2.

In each of the above procedures, the relationship between gradient magnetic fields Gx, Gy and Gz and slice configuration, projection and warp can be accounted for optionally.

In another embodiment of the invention, the constituent portion comprising computer 11 and display device 12, is provided with a high speed image computation device capable of completing computation for the image, for example, within one second by a pipeline system or parallel computation and operation console 30 is adapted so that various imformation, for example, pulse sequence or scan parameters, such as RF pulse intervals, etch, which are applied to the high speed image computation device, can be inputted.

Then, after taking an image with the optimized pulse sequence and scan parameters, as described above, to obtain a calculated image for T1, T2, $\rho$, scan parameters are inputted through the above mentioned input means to realize an image at a contrast which is optimal for diagnosis in real time.

For example, setting buttons for Td, Ts, Tr are disposed on the input means, and Td, Ts, Tr are set corresponding to the period of time the setting buttons are depressed. The set values can simultaneously be displayed and confirmed on display device 12. The high speed image computation device computes an image at a high speed when the pulse sequence and scan parameters thus are set by using the values for T1, T2, $\rho$. The image obtained is displayed on display device 12.

For example, when the Tr buttom is continuously depressed, the image contrast is varied along with a change in Tr. Thus, one can easily determine a point in real time when an optimal contrast, such as for use in diagnosis, exists by simply depressing the button.

Furthermore, an image can be easily obtained under conditions which are not actually realized, such as infinite Tr or an image requiring an extremely long imaging time.

Moreover, with the invention, it is also possible to use a phantom image, which would have no adverse affect on the pulse sequence, to distinguish various diseases. For example, a linear coupling image for T1, T2, $\rho$, making the Fisher's identifying function maximum, can be used. Furthermore, a push buttom may be used for each of T1, T2, $\rho$, and the linear coupling can be attained with suitable weighting corresponding to the times the button are depressed.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A nuclear magnetic resonance imaging device comprising control and computation means, wherein radio frequency pulses and magnetic fields are applied to an object in time relationships designated by said control and computation means to generate nuclear magnetic resonance signals and an image of said object is obtained by using said nuclear magnetic resonance signals; wherein said device further comprises an operation console having input means for setting input information desired for said device; said control and computation means being adapted to store relaxation times T1, T2, nuclei density $\rho$, pulse sequences suitable for obtaining a calculated image, and scan conditions, including scan parameters; said scan conditions being determined externally or internally by the following procedure and being used as scan conditions; said scan conditions being read out from said control and computation means under designation from said operation console and said image being taken in accordance with said scan conditions;

wherein said procedure comprises
   selecting and determining a pulse sequence to be used;
   determining a theoretical equation of signal intensity in accordance with said pulse sequence selected in a manner as described above and with values for T1, T2, $\rho$, at one or more points, as representative points within a range of values T1, T2, $\rho$, to be noted, and determining a variance or standard deviation of a calculated image for T1, T2, $\rho$, as a function of scan parameters from said theoretical equation and variance in values for T1, T2, $\rho$ and original image; and
   determining scan parameters with which a total sum of said variance or standard deviation of desired calculated image, or a total sum of weighted variance or standard deviation of said desired calculated image, among said calculated images for T1, T2, $\rho$, takes a local minimum value, and using said scan parameters as optimum scan conditions.

2. The device of claim 1, wherein said operation console is adapted so that said input means can be set for noted portions, values for T1, T2, $\rho$, to be noted, or for scan conditions of the object, and so that when noted portion or values for T1, T2, $\rho$, to be noted are set, scan conditions suitable thereto are read out from said control and computation means.

3. The device of claim 1, wherein said control and computation means are adapted so that values for relaxation times T1, T2, or nuclei density $\rho$ are determined, depending on type of images intended to be obtained, by using a plurality of original images taken using said scan conditions, determined in a manner as described above, and said theoretica equation of signal intensity for each image relevant to said scan conditions; and a calculated image for relaxation times T1, T2 and nuclei density $\rho$ is determined based on values for said relaxation times T1, T2 and nuclei density $\rho$.

4. The device of claim 1, wherein said control and computation means calculates one or more images for T1, T2, $\rho$, using the following procedure
   selecting and determining a pulse sequence;
   determining a theoretical equation of signal intensity in accordance with said pulse sequence determined as above and values for T1, T2, $\rho$, at one or more points, as representative points within a range for values T1, T2, $\rho$, to be noted, and determining a variance or standard deviation of calculated image for T1, T2, $\rho$ from said theoretical equation, values for T1, T2, $\rho$, and variance of an original image;
   determining scan parameters with which total sum of said variance or standard deviation of a desired calculated image or total sum of variance or standard deviation of a weighted calculated image, among said calculated images for T1, T2, $\rho$, takes a local minimum value;
   applying radio frequency pulses and magnetic fields for said scan parameters as determined in a manner described above, at a timing to satisfy said scan parameters, thereby to generate nuclear magnetic resonance signals and obtaining a plurality of original images of said object using said nuclear magnetic resonance signals;
   determining values for relaxation times T1, T2, or nuclei density $\rho$, depending on type of image to be obtained, by using a plurality of original images and said theoretical equation, for each image concerning said scan conditions determined in a manner as above described; and
   determining a calculated image for relaxation times T1, T2 or nuclei density $\rho$ from values for relaxation times T1, T2 or nuclei density $\rho$ determined in a manner as above described.

5. The device of claim 1, wherein said theoretical equation is a signal intensity formula including effect of slice configuration.

6. The device of claim 1, wherein said variance of said original images has the following formula $$\text{variance} = \sigma^2 \alpha n^{-1} T a^{-1}$$

wherein n represents an average number of original images and Ta represents a sampling period.

7. The device of claim 1, wherein said coantrol and computation means are adapted so that an image is taken three times, while varying scan parameters in a SRSE method and a calculated image for T1, T2, $\rho$, is obtained from said three images thus obtained.

8. The device of claim 1, wherein said control and computation means are adapted so that the following equations and values are used, as said theoretical equation of signal intensity and as values for scan parameters applied in taking an image, when determining a calculated image for T1, T2, $\rho$, from three images in a SRSE method; wherein said theoretical equation is as follows $$C_{SRSE} \cdot \exp(-Ts/T2)\{1 - 2 \cdot \exp(-Tr/T1 + Ts/2T1) + \exp(-Tr/T1)\} \cdot \rho$$

wherein $C_{SRSE}$ is a coefficient representing effect of slicing; and wherein values of scan parameters are obtained by averaging the following (i), (ii), (iii) at a ratio of 1.4:1:1; wherein (i) is Tr=0.3 sec, Ts=0.22 sec, and (ii) is Tr=1.28 sec, Ts=0.025 sec and (iii) is Tr=0.64 sec, Ts=0.109 sec, wherein Tr is time between each view, Ts is time from 90° pulse to center in echo signal.

9. The device of claim 1, wherein said control and computation means are adapted so that a calculated image for T1, T2, $\rho$, is obtained from three images in a SRSE method and a SR2SE method.

10. The device of claim 1, wherein said control and computation means are adapted so that the following equations and values are used, as said theoretical equations and values of scan parameters applied in taking an image, when obtaining a calculated image for T1, T2, $\rho$, from three images in a SRSE method and a SR2SE method, wherein said theoretical equation used in said SRSE method is as follows $$C_{SRSE} \cdot \exp(-Ts/T2)\{1 - 2\,\text{ex}(-Tr/T1 + Ts/2T1) + \text{ex}(-Tr/T1)\} \cdot \rho$$

wherein said theoretical equation used in said SR2Se method is as follows $$Mo = C_{SR2SE}\{1 - 2\,\text{ex}(-Tr/T1 + Ts1/T1 + Ts2/T1) + 2\exp(-Tr/T1 + Ts1/2T1) - \exp(-Tr/T1)\} \cdot \rho$$

wherein a first echo is Mo·exp($-Ts1/T2$), and a second echo is Mo·exp($-Ts1/T2-Ts2/T2$), and wherein $C_{SRSE}$ and $C_{SR2SE}$ are coefficients representing effect of slice configuration; and wherein said scan parameters are obtained by averaging the following (i), (ii) at a ratio of 1.8:1, wherein (i) is the SRSE with Tr=0.34 sec, Ts=0.31 sec, and (ii) is the SR2SE method with Tr=1.38 sec, Ts1=0.021 sec, Ts2=0.09 sec, and wherein Tr is time between each view, Ts1 is time from application of 90° pulse to peak point in first echo signal, and Ts2 is time from peak point in first echo signal to peak point in second echo signal.

11. The device of claim 1, wherein said control and computation means are adapted so that an image is taken three times, while varying scan parameters in a FRSE method and a calculated image for T1, T2, $\rho$, is obtained from the three images thus obtained.

12. The device of claim 1, wherein said control and computation means are adapted so that the following equations and values are used, as said theoretical equations of signal intensity and as values for scan parameters applied in taking an image, when obtaining a calculated image for T1, T2, $\rho$, from three images in a FRSE method; wherein said theoretical equation is as follows $$\exp(-Ts1/T2) \cdot \frac{1 - \exp(-Td/T1)}{1 - \exp(-Td/T1 - Ts1/T2 - Ts2/T2)} \cdot \rho$$

wherein said scan parameters are obtained by averaging the following (i), (ii) and (iii) at a ratio of 3.4:1:1, wherein (i) is Tr=0.14 sec, Ts1=Ts2=0.023 sec; (ii) is Tr=0.74 sec, Ts1=Ts2=0.016 sec and (iii) is Tr=1.18 sec, Ts1=0.099 sec, Ts2=0.031 sec; and wherein Tr is time between each view, Ts1 is time from 90° pulse application to peak point in echo signal and Ts2 is time from peak point in echo signal to application of first recovery 90° pulse.

13. The device of claim 1, wherein said control and computation means are adapted so that a calculated image for T1, T2, $\rho$, is obtained from images in a FRSE method and a FR2SE method.

14. The device of claim 1, wherein said control and computation means are adapted so that the following equations and values are used, as said theoretical equations of signal intensity and as values for scan parameters applied in taking an image, when obtaining a calculated image for T1, T2, $\rho$, from three images in a FRSE method and a FR2SE method, wherein said theoretical equation used in said FRSE method is as follows $$\exp(-Ts1/T2) \cdot \frac{1 - \exp(Td/T1)}{1 - \exp(Td/T1 - Ts1/T2 - Ts2/T2)} \cdot \rho$$

and wherein said theoretical equation used in said FR2SE method is as follows $$Mo = \frac{1 - \text{ex}(-Td/T1)}{1 - \exp(-Td/T1 - Ts1/T2 - Ts2/T2 - Ts3/T2)} \cdot \rho$$

wherein a first echo is Mo·exp($-Ts1/T2$) and a second echo is Mo·exp($-Ts1/T2-Ts2/T2$); and wherein said scan parameters are obtained by averaging the following (i), (ii) at a ratio of 3.8:1, wherein (i) is the FRSE method with Tr=0.16 sec, Ts1=Ts2=0.026 sec, and (ii) is the FR2SE method with Tr=0.62 sec, Ts1=0.021 sec, Ts2=0.081 sec, Ts3=0.031 sec; and wherein Tr is the time between each view, Ts1 is time from 90° pulse application to peak in first echo signal, Ts2 is time from peak point in first echo signal to peak point in second echo signal, and Ts3 is time from peak pint in second echo signal to second 90° pulse.

15. The device of claim 1, wherein said control and computation means are adapted os that a calculated image for T1, T2, $\rho$, is determined from three images in a IRSE method and a SR2SE method.

16. The device of claim 1, wherein said control and computation means are adapted so that the following equations and values are used, as theoretical equations of signal intensity and as values for scan parameters applied in taking an image, when obtaining a calculated image for T1, T2, ρ, from three images in a IRSE method and a SR2SE method, wherein said theoretical equation used in a IRSE method is as follows $$C_{IRSE} \cdot \exp(-Ts/T2)\{1-2\exp(-Td/T1)+2\cdot\exp(-Tr/T1+Ts/2T1)-\exp(-Tr/T1)\}\cdot\rho$$

and said theoretical equation used in a SR2SE method is as follows $$Mo = C_{SR2SE}\{1-2\exp(-Tr/T1+Ts1/T1+Ts2/2T1)+2\cdot\exp(-Tr/T1+Ts1/2T1)-\exp(-Tr/T1)56\cdot\rho$$

wherein a first echo is $Mo \cdot \exp(-Ts1/T2)$ and a second echo is $Mo \cdot \exp(-Ts1/T2-Ts2/T2)$, and wherein $C_{IRSE}$, $C_{SR2SE}$ are coefficients representing effect of slicing and wherein scan parameters are obtained by averaging the following (i), (ii) at a ratio of 1:1.9, wherein (i) is the IRSE method with Tr=1.2 sec, Td=0.23 sec, Ts=0.031 sec, and (ii) is the SR2SE method with Tr=0.6 sec, Ts1=0.018 sec, Ts2=0.089 sec, wherein Tr is time between each view, Td is time from application of inversion recovery pulse to 90° pulse, Ts is time from application of 90° pulse to peak point in echo signal, Ts1 is time from 90° pulse application to peak point in first echo signal and Ts2 is time from peak point in first echo signal to peak point in second echo signal.

17. The device of claim 1, wherein said control and computation means are adapted os that a calculated image for T1, T2, ρ, is determined from three images in a IRSE method and a FR2SE method.

18. The device of claim 1, wherein said control and computation means are adapted so that the following equations and values are used, as said theoretical equations of signal intensity and as values for scan parameters applied in taking an image, when determining a calculated image for T1, T2, ρ, from three images in a IRSE method and a FR2SE method, wherein said theoretical equation used in a IRSE method is as follows $$C_{IRSE} \cdot \exp(-Ts/T2)\{1-2\cdot\exp(-Td/T1)+2\cdot\exp(-Tr/T1+Ts/2T1)-\exp(-Tr/T1)\}\cdot\rho$$

and said theoretical equation used in a FR2SE method is as follows $$Mo = \frac{1-\exp(-Td/T1)}{1-\exp(-Td/T1-Ts1/T2-Ts2/T2-Ts3/T2)} \cdot \rho$$

wherein a first echo is $Mo \cdot \exp(-Ts1/T2)$ and a second echo is $Mo \cdot \exp(-Ts1/T2-Ts2/T2)$; and wherein said scan parameters are obtained by averaging the following (i), (ii) at a ratio of 1:1.4, wherein (i) is the IRSE method with Tr=1.16 sec, Td=0.221 sec, Ts=0.031 sec, and (ii) is the FR2SE method with Tr=0.82 sec, Ts1=0.018 sec, Ts2=0.082 sec, Ts3=0.031 sec; and wherein Tr is the time between each view, Ts1 is time from application of 90° pulse to peak pint in first echo signal, Ts2 is time from peak point in first echo signal to peak point in second echo signal, Ts3 is time from peak point in second echo signal to peak point in second 90° pulse, and Td is time from application of inversion recovery pulse to 90° pulse.

19. The device of claim 1, wherein said control and computation means are adapted so that an image is taken by pulse sequence in a IRnSE method and a FRmSe method, and a calculated image for T1, T2, ρ, is obtained from (n+m) images thus obtained, wherein n and m are integers.

20. The device of claim 1, wherein said control and computation means are adapted so that an image is taken by pulse sequence in a IR3SE method and a FR4SE method, to obtain seven images and an image for T1, T2, ρ, is calculated from the seven images thus obtained.

21. The device of claim 1, wherein the control and computation means are adapted so that an image is taken by a IR3SE method and a FR4SE method to obtain seven images, and an image for T1, T2, ρ, is calculated from the seven images and the following values are used as scan parameters, (i) in the IR3SE method a predetermined number of views are scanned with Tr=2.1 sec, Td=0.46 sec, Ts1=0.02 sec, Ts2=0.02 sec, and (2) in the FR4SE method a predetermined number of views are scanned with Tr=1.3 sec, Ts1=0.02 sec, Ts2=0.073 sec, Ts3=0.02 sec, and wherein the seven images are determined by averaging the above data obtained in the SR3SE and FR4SE methods at a ratio of 1:2.

22. The device of claim 1, wherein said control and computation means are adapted so that an image taken by a IR3SE method and a FR4SE method, is used to obtain seven images, an image for T1, T2, ρ, is calculated from the seven images and the following values are used as scan parameters, (1) with a predetermined number of views being scanned in the IR3SE method, Tr=1.28 sec Td=0.37 sec, Ts1=0.02 sec, Ts2=0.02 sec, and (2) with a predetermined number of views being scanned in the FR4SE method, Tr=1.1 sec, Ts1=0.02 sec, Ts2=0.073 sec, Ts3=0.02 sec; wherein the seven images are determined by averaging data in the FR4SE and IR3SE method at a ratio of 1:1.

23. The device of claim 1, wherein said control and computation means are adapted so that an image is taken by pulse sequence in the IRnSE method and a SRmSE method and a calculated image for To, T2, ρ, is obtained from (n+m) images thus obtained, wherein n and m are integers.

24. The device of claim 1, wherein said control and computation means are adapted so that an image is taken by pulse sequence in a IR(m−1)SE method and a SRmSE method and a calculated image for T1, T2, ρ, is obtained from (2m−1) images thus obtained, wherein m is an integer.

25. The device of claim 1, wherein said control and computation means includes means for equalizing the number of 180° pulses in the pulse sequence with respect to the parity thereof both in a IRnSE method and in a SRmSE method, and for equalizing repeating time Tr in both methods.

26. The device of claim 1, wherein said control and computation means are adapted so that an image is taken by a IR3SE method and a SR4SE method to obtain seven images and an image for T1, T2, ρ, is calculated from the seven images thus obtained.

27. The device of claim 1, wherein said control and computation means are adapted so that an image is taken by a IR3SE method and a SR4SE method to obtain seven images; an image for T1, T2, ρ, is calculated; and the following values are used as scan parameters; (1) when a predetermined number of views are scanned in the IR3SE method, Tr=2.36 sec, Td=0.58 sec, Ts1=0.02 sec, Ts2=0.02 sec; (2) a when a predetermined number of view are scanned in the SR4SE method, Tr=2.36 sec, Ts1=0.02 sec, Ts2=0.079 sec;

and wherein the seven images are determined by averaging the data in the IR3SE method and SR4SE method at a ratio of 1:1.

28. The device of claim 1, wherein said control and computation means are adapted so that an image is taken by a IR3SE method and a SR4SE method to obtain seven images; an image for T1, T2, $\rho$, is calculated from said seven images and the following values are used as scan parameters, (1) when a predetermined number of views are scanned in the IR3SE method, Tr=1.18 sec, Td=0.41 sec, Ts1=0.02 sec, Ts2=0.02 sec, and (2) when a predetermined number of views are scanned in the SR4SE method, Tr=1.18 sec, Ts1=0.02 sec, Ts2=0.074 sec; and the seven images are determined by averaging the data in the IR3SE method and the SR4SE method at a ratio of 1:1.

29. The device of claim 1, wherein said control and computation means include means for reconstituting an image in accordance with a pulse sequence and scan parameters newly set from said operation console, by computation based on calculated values for T1, T2, $\rho$ that have already been determined.

* * * * *